United States Patent
Gerber et al.

(10) Patent No.: US 7,982,438 B2
(45) Date of Patent: Jul. 19, 2011

(54) METHOD AND CIRCUIT FOR CONTROLLING THE REFRESH RATE OF SAMPLED REFERENCE VOLTAGES

(75) Inventors: Johannes Gerber, Unterschleissheim (DE); Matthias Arnold, Freising (DE); Korbinian Huber, Altfraunhofen (DE)

(73) Assignee: Texas Instruments Incorporated, Dallas, TX (US)

( * ) Notice: Subject to any disclaimer, the term of this patent is extended or adjusted under 35 U.S.C. 154(b) by 666 days.

(21) Appl. No.: 12/144,996

(22) Filed: Jun. 24, 2008

(65) Prior Publication Data

US 2009/0051331 A1 Feb. 26, 2009

Related U.S. Application Data

(60) Provisional application No. 61/016,725, filed on Dec. 26, 2007.

(30) Foreign Application Priority Data

Jul. 4, 2007 (DE) .......................... 10 2007 031 055

(51) Int. Cl.
*H01M 10/46* (2006.01)
(52) U.S. Cl. ...................................................... 320/166
(58) Field of Classification Search .................. 320/107, 320/166, 167; 327/100, 157
See application file for complete search history.

(56) References Cited

U.S. PATENT DOCUMENTS

| | | | |
|---|---|---|---|
| 4,768,170 A | 8/1988 | Hoff | |
| 5,392,251 A | 2/1995 | Manning | |
| 6,278,242 B1 | 8/2001 | Cok et al. | |
| 2005/0168292 A1* | 8/2005 | Frans et al. | 331/16 |
| 2005/0248755 A1 | 11/2005 | Chou et al. | |
| 2006/0257804 A1* | 11/2006 | Chian et al. | 431/24 |

FOREIGN PATENT DOCUMENTS

| | | |
|---|---|---|
| DE | 0909294 | 3/1999 |
| EP | 0 902 294 A | 3/1999 |

* cited by examiner

*Primary Examiner* — Edward Tso
(74) *Attorney, Agent, or Firm* — Robert D. Marshall, Jr.; W. James Brady; Frederick J. Telecky, Jr.

(57) ABSTRACT

The present invention relates to controlling the refresh rate of the reference voltage on a sampling capacitor ($C_{samp}$). A comparator (COMP) compares the voltage on a first capacitor (C1) with the voltage on a second capacitor (C2). These capacitors have the capacitance of the sampling capacitor ($C_{samp}$). Upon each refresh the first capacitor (C1) samples a first voltage ($V_a$) and the second capacitor samples a lower second voltage ($V_b$). The first capacitor (C1) is discharged at a first current $I_a$ via a first leakage current source (D1). The second capacitor (C2) is discharged at a second current $I_b$ via a second leakage current source (D2). The comparator (COMP) triggers a refresh when the voltages equal. The first current $I_a$ is preferably an integer N times the second current $I_b$.

8 Claims, 2 Drawing Sheets

METHOD AND CIRCUIT FOR CONTROLLING THE REFRESH RATE OF SAMPLED REFERENCE VOLTAGES

CLAIM OF PRIORITY

This application claims priority under 35 U.S.C. 119(a) to German Patent Application No. 10 2007 031 055.4 filed Jul. 4, 2007 and 35 U.S.C. 119(e)(1) to U.S. Provisional Application No. 61/016,725 filed Dec. 26, 2007.

TECHNICAL FIELD OF THE INVENTION

The technical field of this invention is controlling the refresh rate of a reference voltage sampled on a sampling capacitor and an electronic device with a corresponding circuit.

BACKGROUND OF THE INVENTION

An approach to saving power in integrated electronic devices involves sampling a reference voltage. This reference voltage is usually generated by a band gap reference generator on a capacitor. While the reference voltage is stored on the sampling capacitor, the reference generator circuit can be switched off or put in a power down mode to reduce static power consumption. This reduces the average supply current of the reference generator and leads to lower power consumption.

The voltage on the sampling capacitor decreases over time primarily by parasitic leakage currents. Thus there must be a refresh mechanism for the sampled voltage. This refresh mechanism ensures that the reference voltage stays within a certain range. A prior art solution compares the voltage sampled on the sampling capacitor to a specific reference voltage. When the voltage on the sampling capacitor is equal to the reference voltage, a comparator triggers a refresh of the voltage on the sampling capacitor. The circuitry needed to implement this control loop requires a comparator, an additional reference voltage generator which cannot be switched off and further biasing circuitry. Accordingly, the power consumption and the chip area needed to implement the circuitry is large. This counteracts the desired power savings. Another prior art approach uses a fixed periodic refresh cycle selected for the worst case. This fixed periodic refresh cycle is carried out as if the highest leakage current were present irrespective of the sampling capacitor's actual leakage current. Accordingly, both the refresh rate and the power consumption are unnecessarily high.

SUMMARY OF THE INVENTION

It is an object of the present invention to provide a method and electronic device controlling the refresh rate of a sampled reference voltage on a sampling capacitor that requires less chip area and less power than the prior art.

In a first embodiment of this invention the integrated electronic device includes circuitry for controlling the refresh rate of a reference voltage on a sampling capacitor. The circuitry includes a sampling capacitor, a comparator, a first capacitor matched with the sampling capacitor and coupled with a first input of the comparator, a second capacitor matched with the sampling capacitor and coupled with the second input of the comparator. Further, there is a first leakage current source coupled with the first capacitor for leaking a first current and a second leakage current source coupled to the second capacitor for leaking a second current. The leaking current sources are dimensioned to provide different amounts of leakage currents and an output of the comparator is connected so as to trigger a refresh of the sampling capacitor. The leakage current sources are physical structures, layers or the like rather than virtual current sources. They are at least partially coupled to the capacitors and produce the respective leakage currents due to their physical properties. The integrated electronic device with a circuitry according to this aspect of the present invention does not need an additional reference voltage. Such an additional reference voltage would have to be present the whole time in order to allow a comparison between the voltage on the sampling capacitor and the reference voltage level. The voltages sampled on the first and the second capacitors are sampled and refreshed synchronously with the reference voltage level on the sampling capacitor. The voltage drop on the first capacitor is a function of the difference voltage between the first and the second voltage levels on the first and second capacitors and the ratio of the leakage currents.

Typically, the voltage level on the second capacitor is lower than the first voltage. The leakage current sources are preferably selected so that the first leakage current is N times the second leakage current. This enables a very accurate implementation of the ratio of the two leakage currents, as a predefined leakage current structure can be reused and implemented several times in order to provide a leakage current which is an integer multiple of another leakage current. Accordingly, the structure of the first leakage current source can be equivalent to a copy of N times the structure of the second leakage current source. The two capacitors preferably have the same capacitance value as the sampling capacitor and additionally one of the capacitors can have substantially the same leakage current as the sampling capacitor. The first and the second capacitor are charged to respective first and second voltages. The first and the second capacitor are discharged by different leakage currents. The capacitors discharge with differing rates. After a specific period of time, the voltages on the first and the second capacitors are equal. The capacitors and the leakage currents are selected so that the time between beginning the discharge and when the voltages are equal depends only on the initial voltage levels on the first and the second capacitors and the ratio of the leakage currents. The voltage drop $V_{drop}$ on the second capacitor is give by:

$$V_{drop} = \frac{V_a - V_b}{N - 1} \quad (1)$$

where: $V_a$ is the initial voltage on the first capacitor after refresh; $V_b$ is the initial voltage on the second capacitor after refresh; and the factor N is the ratio of the magnitude of the first leakage current divided by the second leakage current. The voltage drop $V_{drop}$ is independent of any fixed term and is only a function of the difference voltage ($V_a - V_b$) between the initial reference voltage level on the first capacitor and the initial reference voltage level on the second capacitor. However, the maximum allowable voltage drop $V_{drop}$ is given by the specific requirements of the circuit using the invention. Equation (1) will be described in more detail herein below with reference to FIG. 4. The voltage levels on the first capacitor and the second capacitor can be easily adapted using switchable resistor taps or the like.

A big advantage of the present invention is automatic adjustment to temperature changes. The whole circuitry experiences basically the same temperature behavior as the sampling capacitor and its environment. Thus the first and second leakage currents increase and decrease according to the temperature of the integrated device. There is no need to resort to a fixed refresh cycle for the worst case leakage current which occurs at high temperatures. This invention flexibly adapts the refresh time and thereby achieves considerable power savings.

The factor N can be between 5 and 20. The initial voltage on the first capacitor at the beginning of a sampling period can be 1.6 V and the initial voltage level on the second capacitor at the beginning of the sampling period can be 1.2 V. The leakage current source can be a reverse biased diode element. These are only examples. There are many other ways to implement and dimension structures according to the present invention.

The present invention provides a method for controlling the refresh rate of a reference voltage sampled on a sampling capacitor. This method includes sampling a first voltage on a first capacitor, sampling a second voltage smaller than the first voltage on a second capacitor, discharging the first capacitor by a first leakage current and discharging the second capacitor by a second leakage current. The method compares the voltages on the first capacitor and the second capacitor during discharge of the capacitors. The method triggers a refresh of the reference voltage on the sampling capacitor when the voltage levels on the capacitors are equal.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
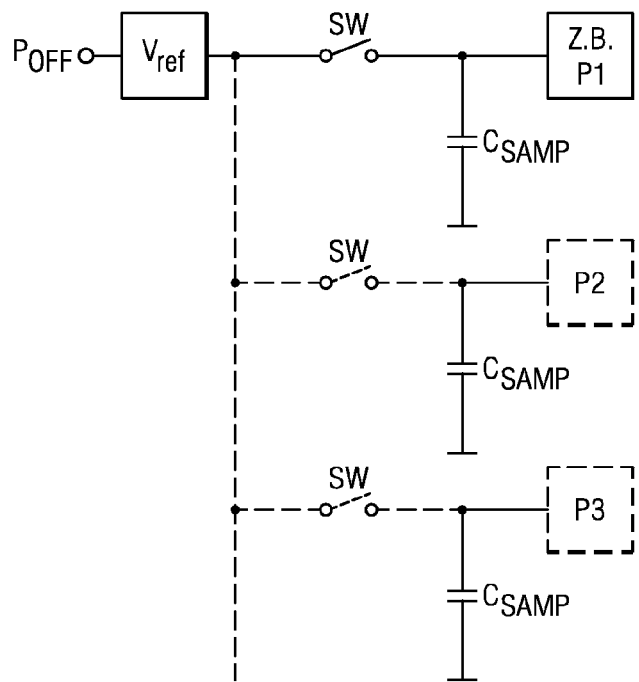
FIG. 1 illustrates a simplified circuit diagram of a reference voltage sampling structure according to the prior art.

FIG. 1 illustrates a simplified circuit diagram overview of a system using sampled reference voltages. A reference voltage source $V_{ref}$ produces a reference voltage. This reference voltage is sampled on multiple sampling capacitors $C_{samp}$ by corresponding switches SW. When the reference voltage is sampled on the sampling capacitors $C_{samp}$ the switches SW open and the reference voltage generator $V_{ref}$ is switched off by an enable signal applied to the input $P_{OFF}$. The reference voltages on the sampling capacitors are used for several different stages P1, P2 and P3. These may include electronic circuitry such as a low-drop-out (LDO) supply voltage generator or different circuitry. Power savings are achieved by switching off the reference voltage generator $V_{ref}$. Timing for the refresh of the capacitors must be determined by a control loop such as the one shown in FIG. 2.

Figure 2:
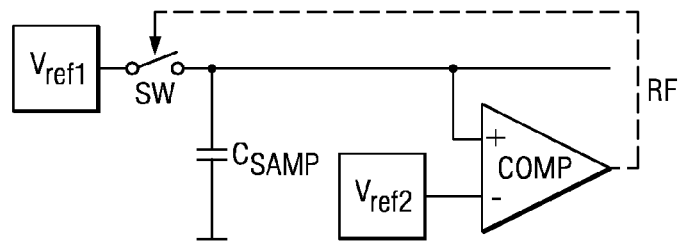
FIG. 2 illustrates a simplified circuit diagram of a prior art refresh cycle control.

FIG. 2 illustrates a simplified circuit diagram of a control loop for the reference voltage on the sampling capacitors $C_{samp}$. First reference voltage generator $V_{ref1}$ is sampled by switch SW on a sampling capacitor $C_{samp}$. The sampling capacitor $C_{samp}$ is coupled to a positive input of a comparator COMP. A second reference voltage generator $V_{ref2}$ is coupled to the negative input of comparator COMP. If the voltage level on the sampling capacitor $C_{samp}$ reaches the level defined by the second reference voltage generator $V_{ref2}$, the comparator COMP issues a trigger signal RF. This indicates that the sampling capacitor $C_{samp}$ needs to be refreshed. Thus switch SW is closed and the sampling capacitor $C_{samp}$ is coupled to the reference voltage source $V_{ref1}$ to refresh the voltage level on the sampling capacitor $C_{samp}$. A major disadvantage of the structure shown in FIG. 2 is the second reference voltage generator $V_{ref2}$. This reference voltage source $V_{ref2}$ cannot be switched off and therefore constantly consumes current. The components in the second reference voltage source $V_{ref2}$ in the comparator COMP require extra chip area.

Figure 3:
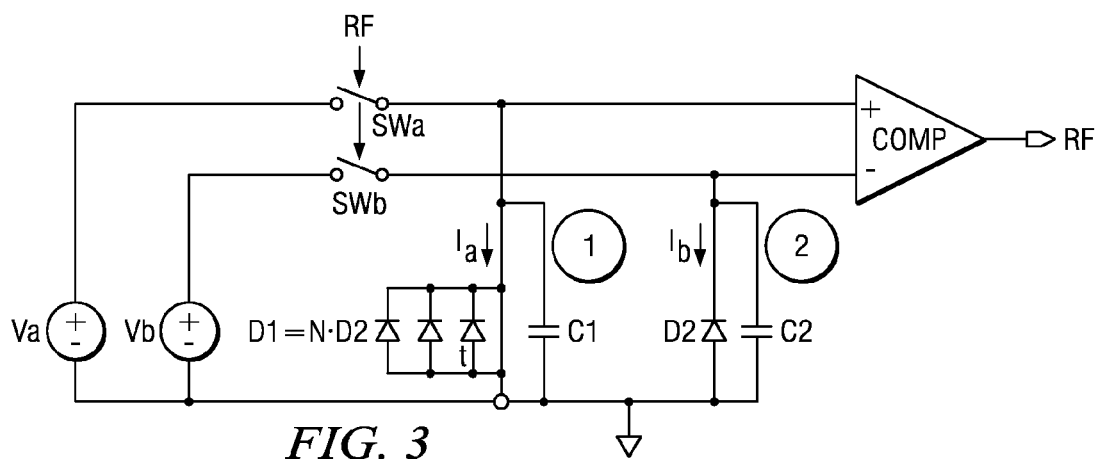
FIG. 3 illustrates a simplified circuit diagram of an embodiment of the present invention.

FIG. 3 illustrates a simplified circuit diagram of an embodiment of the present invention. Comparator COMP is coupled to a first capacitor C1 and a second capacitor C2. These capacitors are also coupled to reverse biased diodes D1 and D2 which provide respective leakage currents $I_a$ and $I_b$ to nodes 1 and 2. However, the reverse biased diodes and D2 merely symbolize leakage current sources. Any type leakage current generating structure may be coupled to the capacitors to establish the appropriate leakage currents. Real diodes are not required and the present invention should not be understood to be limited to diodes as leakage current sources. The ratio of the leakage currents is typically an integer value N. This simplifies integrated circuit implementation. Accordingly, the diode D1 or other leakage current structure is typically N times the structure of D2. First capacitor C1 has substantially the same capacitance value as the sampling capacitor $C_{samp}$, which is not shown in FIG. 3. Capacitors C1 and C2 preferably have equal capacitance C. During a refresh cycle at the beginning of a sampling period, the first capacitor C1 is charged to a voltage $V_a$ through switch $SW_a$ and the second capacitor C2 is charged to a second voltage $V_b$ through switch $SW_b$. After charging nodes 1 and 2 to the respective voltage levels $V_a$ and $V_b$, the switches $SW_a$ and $SW_b$ are both opened to preserve the charge on the capacitors. The leakage currents $I_a$ and $I_b$ will discharge the capacitors C1 and C2 and the voltage levels at nodes 1 and 2 will decrease. This will be explained in more detail with reference to FIG. 4.

Figure 4:
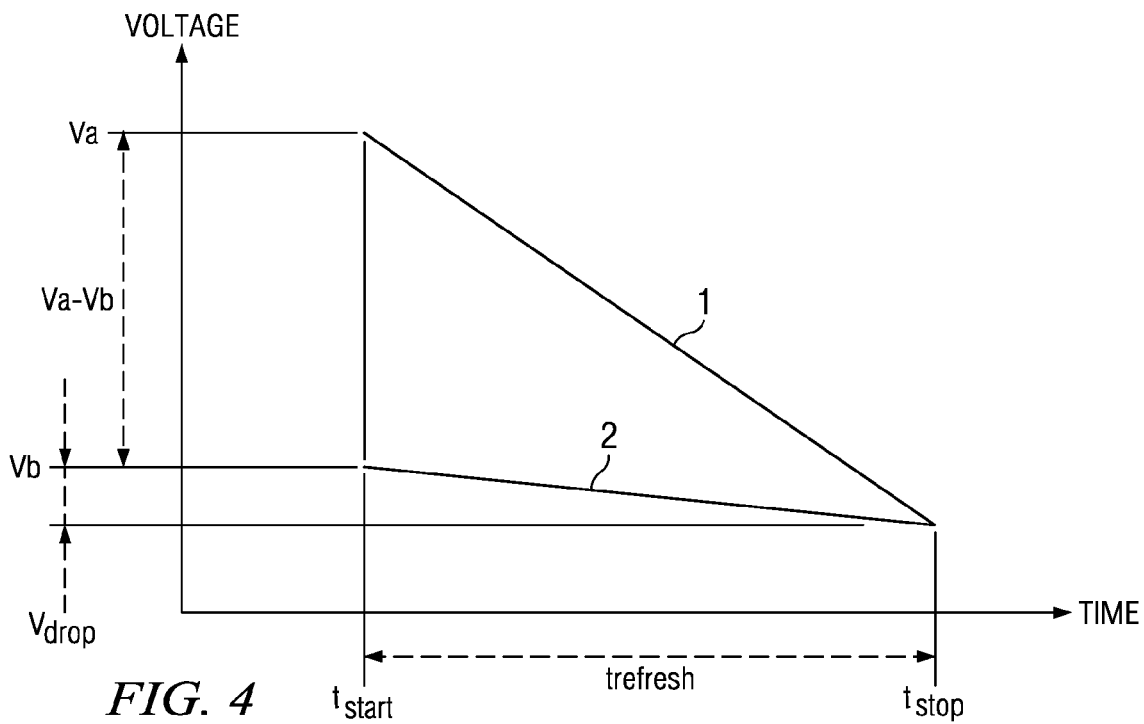
FIG. 4 illustrates waveforms of voltages of the embodiment of FIG. 3.

FIG. 4 illustrates the voltages $V_a$ and $V_b$ at nodes 1 and 2 in FIG. 3 directly after sampling at time $t_{start}$. $V_a$ is greater than $V_b$. The procedure to determine the ratio and the magnitudes of the two voltages $V_a$ and $V_b$ will be described below in more detail. After sampling the voltages $V_a$ and $V_b$, the leakage currents $I_a$ and $I_b$ cause the voltage levels on the first and the second capacitors C1 and C2 to decrease substantially linearly, assuming that the leakage currents are substantially constant during a refresh cycle. Since the leakage current $I_a$ on node 1 is greater than $I_b$, the voltage levels on the capacitors decrease with different slopes. In this example $I_a$ is N times greater than $I_b$. After a time $t_{refresh}$ the two voltage levels are equal at time $t_{stop}$. The comparator triggers a refresh. As note in equation (1), the voltage drop $V_{drop}$ on node 2 depends only on the difference voltage $V_a - V_b$ at the time $t_{start}$ and the ratio N of the two leakage currents $I_a$ and $I_b$. At time $t_{stop}$ the switches $SW_a$ and $SW_b$ are closed and the voltage levels at the first and second capacitor C1 and C2 are restored to $V_a$ and $V_b$. When the temperature rises, the leakage currents $I_a$ and $I_b$ increase and the time between $t_{start}$ and $t_{stop}$ ($t_{refresh}$) is reduced. This matches a similar leakage on the sampling capacitors. If the temperature of the circuitry falls, the refresh cycle $t_{refresh}$ automatically adapts and becomes longer. The advantageous effects of the present invention will be further elucidated by the following equations.

The charge balance on the first capacitor at node 1 is expressed as follows:

$$I_a t_{refresh} = (V_a - V_b + V_{drop})C \qquad (2)$$

where: C is the capacitance of the first capacitor, the second capacitor and the sampling capacitor. The relationship between the second capacitor and the corresponding leakage current $I_b$ is:

$$I_b t_{refresh} = V_{drop} C \qquad (3)$$

The leakage current devices such as the reverse biased diodes in this example are dimensioned such that:

$$I_a = N I_b \qquad (4)$$

Combining equations (3) and (4) yields:

$$I_b = \frac{V_{drop} C}{t_{refresh}} = \frac{I_a}{N} \qquad (5)$$

Solving (5) for $t_{refresh}$:

$$t_{refresh} = \frac{V_{drop} C N}{I_a} \qquad (6)$$

Inserting (6) in (2) yields:

$$I_a \frac{V_{drop} C N}{I_a} = (V_a - V_b + V_{drop})C \qquad (7)$$

Accordingly, the capacitance C and the leakage currents $I_a$ and $I_b$ cancel out yielding:

$$V_{drop} N = V_a - V_b + V_{drop} \qquad (8)$$

which provides the final result that has already been given by equation (1) herein above:

$$V_{drop} = \frac{V_a - V_b}{N - 1} \qquad (1)$$

Figure 5:
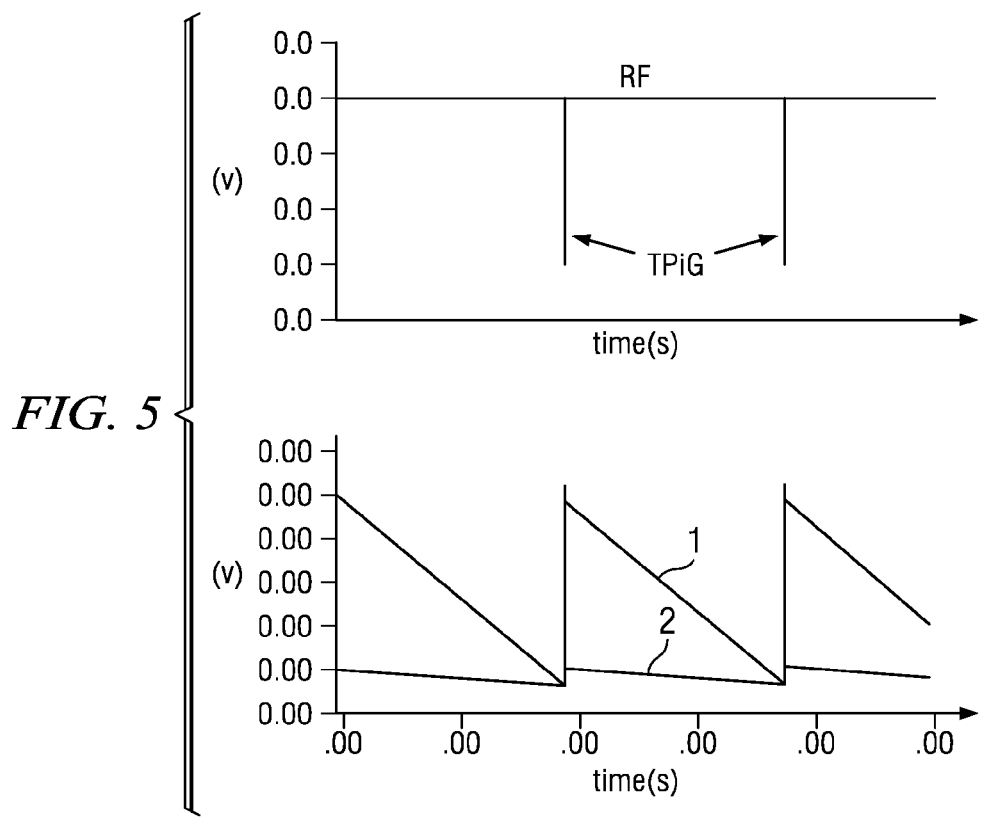
FIG. 5 illustrates other waveforms relating to the embodiment of FIG. 3.

FIG. 5 illustrates s more waveforms relating to the output of the comparator COMP 3 and the voltages at nodes 1 and 2 of the circuitry shown in FIG. 3. When the lines representing the voltage levels at the first capacitor (node 1) and the second capacitor (node 2) intersect, the comparator COMP issues a trigger pulse. This is shown in the upper diagram of FIG. 5. During the rather short pulse, the voltages on the capacitors at node 1 and node 2 are refreshed and the cycle starts anew.

What is claimed is:

1. An integrated electronic device comprising circuitry for controlling the refresh rate of a reference voltage on a sampling capacitor ($C_{samp}$) circuitry comprising:
   a comparator (COMP) having a first input (+), a second input (−)and an output (RF) connected to trigger a refresh of the sampling capacitor ($C_{samp}$) when the a voltage at the first input (+) equals a voltage at the second input (−);
   a first capacitor (C1) having the capacitance of the sampling capacitor ($C_{samp}$) and coupled to a first input (+) of the comparator (COMP);
   a second capacitor (C2) having the capacitance of the sampling capacitor ($C_{samp}$) and coupled to a second input (−) of the comparator ($C_{samp}$);
   a first leakage current source (D1) coupled to the first capacitor (C1) for discharging the first capacitor (C1) with a first current ($I_a$); and
   a second leakage current source (D2) coupled to the second capacitor (C2) for discharging the second capacitor (C2) with a second current ($I_b$), wherein the first and second leakage current sources (D1, D2) are dimensioned to provide different amounts of leakage currents.

2. The electronic device of claim 1, further comprising:
   a first voltage source ($V_a$);
   a first switch ($SW_a$) connecting the first voltage source ($V_a$) to the first capacitor (C1) each time the output (RF) of the comparator (COMP) triggers a refresh;
   a second voltage source ($V_b$) and
   a second switch ($SW_b$) connecting the second voltage source ($V_b$) to the second capacitor (C2) each time the output (RF) of the comparator (COMP) triggers a refresh.

3. The electronic device of claim 1, wherein:
   the first voltage source ($V_a$) has a voltage of 1.6 V; and
   the second voltage source ($V_b$) has a voltage of 1.2 V.

4. The electronic device of claim 1, wherein:
   the first and second leakage current sources (D1, D2) are constructed whereby the first leakage current ($I_a$) is an integral number N times the second leakage current ($I_b$).

5. The electronic device of claim 4, wherein:
   the second leakage current source (D2) is constructed with a first structure; and
   the first leakage current source (D1) is constructed with N copies of the first structure connected in parallel.

6. The electronic device of claim 4, wherein:
   N is an integer between 5 and 20.

7. The electronic device of claim 1, wherein:
   at least one of the first and second leakage current sources (D1, D2) is a reverse biased diode.

8. A method for controlling the refresh of a reference voltage sampled on a sampling capacitor ($C_{samp}$), comprising:
   sampling the reference voltage on the sampling capacitor ($C_{samp}$);
   sampling a first voltage ($V_a$) on a first capacitor (C1);
   sampling a second voltage ($V_b$) smaller than the first voltage ($V_a$) on a second capacitor (C2);
   discharging the first capacitor (C1) by a first leakage current ($I_a$);
   discharging the second capacitor (C2) by a second leakage current ($I_b$) less than the first leakage current ($I_a$);
   comparing the voltages on the first capacitor and the second capacitor during the discharging step, and
   triggering a refresh of the reference voltage on the sampling capacitor ($C_{samp}$) when the voltage levels on the first and second capacitors are equal.

\* \* \* \* \*